United States Patent
Parasram

(10) Patent No.: US 12,422,237 B2
(45) Date of Patent: *Sep. 23, 2025

(54) ADDRESSABLE IGNITION STAGE FOR ENABLING A DETONATOR/IGNITOR

(71) Applicant: Ryan Parasram, Houston, TX (US)

(72) Inventor: Ryan Parasram, Houston, TX (US)

( * ) Notice: Subject to any disclaimer, the term of this patent is extended or adjusted under 35 U.S.C. 154(b) by 406 days.

This patent is subject to a terminal disclaimer.

(21) Appl. No.: 17/514,719

(22) Filed: Oct. 29, 2021

(65) Prior Publication Data

US 2022/0136813 A1    May 5, 2022

Related U.S. Application Data

(60) Provisional application No. 63/107,239, filed on Oct. 29, 2020.

(51) Int. Cl.
| | |
|---|---|
| *F42D 1/055* | (2006.01) |
| *E21B 43/1185* | (2006.01) |
| *F42B 3/12* | (2006.01) |
| *F42D 1/05* | (2006.01) |
| *H03K 17/72* | (2006.01) |

(52) U.S. Cl.
CPC .......... *F42D 1/055* (2013.01); *E21B 43/1185* (2013.01); *E21B 43/11857* (2013.01); *F42B 3/121* (2013.01); *F42D 1/05* (2013.01); *H03K 17/72* (2013.01)

(58) Field of Classification Search
CPC . F42D 1/045; F42D 1/05; F42D 1/055; F42B 3/12; F42B 3/121; F42B 3/122; F42B 3/124; F42B 3/13; E21B 43/1185; E21B 43/11857; H03K 17/72
See application file for complete search history.

(56) References Cited

U.S. PATENT DOCUMENTS

| | | | | |
|---|---|---|---|---|
| 3,175,492 | A | * | 3/1965 | Charrin .................. F42B 3/124 102/202.2 |
| 3,424,924 | A | * | 1/1969 | Christian ................ F41A 19/65 327/473 |
| 3,572,247 | A | * | 3/1971 | Warshall ................ F42B 3/188 361/264 |

(Continued)

FOREIGN PATENT DOCUMENTS

| | | | | |
|---|---|---|---|---|
| CN | 209588863 | | 11/2019 | |
| JP | 3623508 | B2 * | 2/2005 | ............. F42B 3/121 |

OTHER PUBLICATIONS

Machine translation of JP-3623508-B2 (Year: 2005).*

(Continued)

*Primary Examiner* — James S Bergin
(74) *Attorney, Agent, or Firm* — Kearney, McWilliams & Davis, PLLC; William Yarbrough

(57) ABSTRACT

The present invention is directed toward an addressable ignition stage which produces an output sufficient to detonate a secondary explosive, generally. The present invention comprises addressability and ignition functions that may be used together or separately to incorporate a high-power resistor with a thermally conductive substrate allowing for operation at high temperatures for ignition. The ignition stage is amendable to high volume production, exhibits a high degree of reliability, robustness and operational dependability for use alone or configurable into existing technology.

13 Claims, 7 Drawing Sheets

(56) References Cited

U.S. PATENT DOCUMENTS

| | | | | |
|---|---|---|---|---|
| 3,834,313 | A * | 9/1974 | Sato | F42B 3/13 73/167 |
| 4,217,618 | A * | 8/1980 | Kellenbenz | H02H 9/001 361/91.8 |
| 4,306,499 | A * | 12/1981 | Holmes | F42B 3/18 102/202.4 |
| 4,393,779 | A * | 7/1983 | Brede | F42C 11/02 102/210 |
| 4,517,895 | A * | 5/1985 | Rucker | F42B 3/188 102/202.2 |
| 5,485,786 | A * | 1/1996 | Hesse | F41A 19/58 42/84 |
| 5,847,309 | A * | 12/1998 | Baginski | F42B 3/18 102/202.3 |
| 6,462,605 | B1 * | 10/2002 | Hanks | H03K 3/57 327/438 |
| 6,739,264 | B1 * | 5/2004 | Hosey | F42B 3/121 102/202.3 |
| 6,742,508 | B2 * | 6/2004 | Kinge | F02P 3/0838 123/598 |
| 8,576,090 | B2 * | 11/2013 | Lerche | F42D 1/055 340/853.2 |
| 9,688,235 | B2 * | 6/2017 | Yamauchi | F42B 3/121 |
| 10,161,725 | B1 * | 12/2018 | Neyer | F42B 3/11 |
| 12,203,738 | B2 * | 1/2025 | Parasram | E21B 43/1185 |
| 2010/0252323 | A1 * | 10/2010 | Goodman | E21B 43/117 175/4.6 |
| 2011/0090091 | A1 * | 4/2011 | Lerche | F42D 1/055 340/853.2 |
| 2011/0309678 | A1 * | 12/2011 | Shaw | H02J 1/14 307/31 |
| 2012/0186476 | A1 * | 7/2012 | Spring | F42B 3/18 102/202.2 |
| 2012/0186478 | A1 * | 7/2012 | Ritter | F42B 3/113 102/202.9 |
| 2018/0183230 | A1 * | 6/2018 | Kostakis | H01C 7/12 |
| 2019/0162057 | A1 * | 5/2019 | Montoya Ashton | E21B 43/1185 |
| 2019/0234189 | A1 * | 8/2019 | Preiss | E21B 43/11852 |
| 2020/0063536 | A1 * | 2/2020 | Walters | E21B 43/117 |
| 2024/0019234 | A1 * | 1/2024 | Parasram | E21B 43/1185 |

OTHER PUBLICATIONS

Design of Integrated S CB Chip f or Explosive Initiation Ravinder Kumar, Pradeep Kumar, Niraj Singh International Journal of Scientific and Research Publications, vol. 4, Issue 3, Mar. 2014 1 ISSN 2250-3153.

Programmable Electronic Delay Detonator 1Virendra Kumar, 2Vijay Karra, 3Anuradha Singh, 4Biji Babu, 5Amit KumarInternational Journal of Industrial Electronics and Electrical Engineering, ISSN: 2347-6982 vol. 3, Issue-6, Jun. 2015—1Armament Research and Development Establishment, Pashan, Pune-411 021, 2Professor (E&TC), Army institute of technology, pune-411015, 3Army Institute of Technology, Dighi, Savitribai Phule Pune University, Pune-411015.

* cited by examiner

ADDRESSABLE IGNITION STAGE FOR ENABLING A DETONATOR/IGNITOR

FIELD OF THE INVENTION

The present invention relates to techniques for performing wellbore and mining operations. Generally, the present invention relates to techniques for detonating explosive devices. More particularly, the present invention relates to an ignition stage for enabling the denotation in a mining or oil well operation.

BACKGROUND

Oil rigs are positioned at well sites for performing a variety of oilfield operations, such as drilling a wellbore, performing downhole testing, perforating earth formations and producing hydrocarbons in formations. Downhole drilling tools are advanced into the earth from a surface rig to form a wellbore. The wellbore is typically cemented with a casing or pipe in the wellbore. In order to produce oil from an underground formation, an explosive device or perforating gun is typically detonated in the wellbore. The perforating gun launches projectiles or ballistics through the casing and cement and into the underground formations.

Detonators are initiating devices that produce a high energy output in order to detonate a secondary explosive. Some detonators are initiated by electric energy (as can be seen in FIG. 1 which depicts a prior art detonator initiator. Present electric detonator initiators used in oilfield and mining operations typically contain a small nichrome heating element 100 coated in a pyrotechnic which is coupled to a primary explosive, a pair of lead wires 102a and 102b, a resistor 104a and 104b having a resistance greater than 50Ω (as represented in FIG. 1). The nichrome heating element 100 is 38-gauge (0.00397" diameter) wire or smaller. The nichrome heating element 100 typically has a resistance of less than 1Ω. The resistors 104a and 104b add safety to the nichrome heating element by restricting current flow for low voltages. The resistors' power rating ensures the resistors 104a and 104b are not destroyed in heating the nichrome heating element 100.

The prior art detonator initiator as shown in prior art FIG. 1 is difficult to scale in production because the nichrome heating element is extremely small and difficult to inspect and handle. A mounting structure 106 must be created for the nichrome heating element 100. Wires must then be attached to the resistors 104, and each resistor 104/wire 102 leg must be isolated to prevent failure due to shorting. These issues make the prior art detonators, fragile, difficult to produce and correspondingly scale reliably in production.

Therefore, there is a need for a robust detonator that can be easily scaled in manufacturing volumes and is durable in the harsh conditions of an oil well or mining operations.

SUMMARY

Embodiments described herein comprise a detonator initiator device which produces an output sufficient to detonate a small primary explosive or a secondary explosive directly. The detonator itself incorporates a thyristor which has a standoff voltage of >50V AC/DC, allows for large current flow, and ensures detonation while solving the issue of low order pyrolysis resulting from the application of a slow voltage ramp. Moreover, the present invention incorporates a high-power resistor for ignition and a thermally conductive substrate allowing for operation at high temperatures which is mounted on an FR4 circuit board. The detonator initiator is amendable to high volume production, exhibits a high degree of reliability and operational dependability configurable via retrofitting into existing technology. Further, said detonator initiator may incorporate "active", "passive" (or combination "active"/"passive") RFID technology for inventory functions, timing monitoring, determination of physical states, authentication, spatial placement/location verification, tracking and traceability.

BRIEF DESCRIPTION OF THE DRAWINGS

While the novel features and method of use of the invention are set forth above, the application itself, as well as the preferred mode of use and present embodiments, may be best understood, and numerous objects, features, and advantages made apparent to those skilled in the art when read in conjunction with and by referencing the accompanying drawings in view of the appended claims, wherein:

Figure 1:
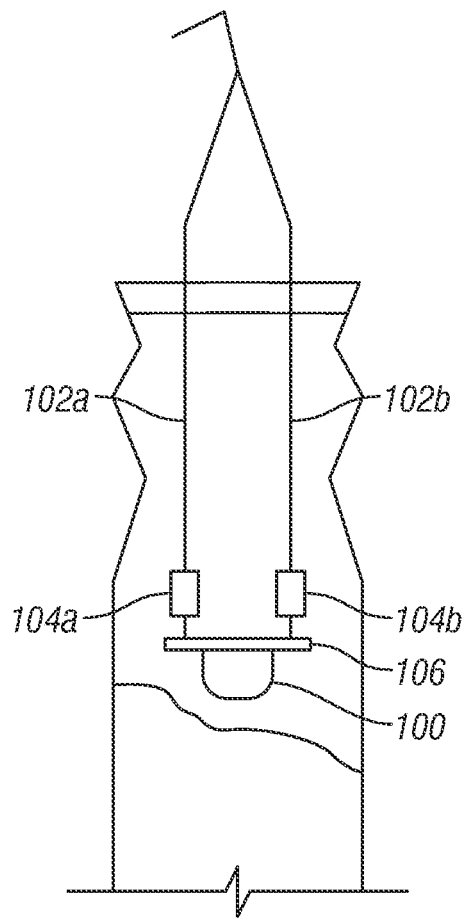
FIG. 1 depicts a prior art detonator initiator.

And, although the present invention, system and method of use are amendable to various modifications and alternative configurations, specific embodiments thereof have been offered by way of example in the drawings and are herein described in adequate detail to teach those having skill in the art how to make and practice the same. It should, however, be understood that the above description and preferred embodiments disclosed, are not intended to limit the invention to one particular embodiment or embodiments disclosed, but, on the contrary, the invention disclosure is intended to cover all modifications, alternatives and equivalents falling within the spirit and scope of the invention as defined within the claim's broadest reasonable interpretation consistent with the specification.

DESCRIPTION OF EMBODIMENT(S)

The description that follows includes exemplary apparatus, methods, techniques, and instruction sequences that embody representative features and configurations, preferred embodiments and the best mode known to inventor of practicing the present inventive subject matter. Yet, it is to be understood that the disclosed embodiments are merely illustrative whereby elements and materials may be substituted for those illustrated and herein described, parts and processes may be rearranged, and certain features of the apparatuses, systems and methods may be utilized independently, in conjunction, in connection, in an ordered configuration or reconfigured—all of which would be apparent and within the contemplation of those persons having ordinary skill in the art having the benefit of this present disclosure.

FIG. 1 is a depiction of a prior art electric detonator 10 having fuse lead wires 102a and 102b connected to 27Ω carbon composition resistors 104a, 104b, in series, whereby insulating header 106 both holds secure fuse lead wires 102a, 102b, separately, and positioned to feed into Nichrome explosive bridgewire (EBW) coated in pyrotechnic 100 for administration of higher voltage electric charge to said EBW, which itself is extremely thin. Therefore, instead of heating up the explosive, the explosive bridgewire is rapidly heated causing the bridgewire to vaporize and explode due to electric resistance heating. The electrically induced explosion thereby fires the detonator's initiator explosive. The application of full high-voltage, high-current charge passing through the bridgewire is alone sufficient to actuate the detonator where lower currents, static electricity, radio signals and other stray 'electrical' signals are insufficient to active the EBW.

Figures 2A, 2B:
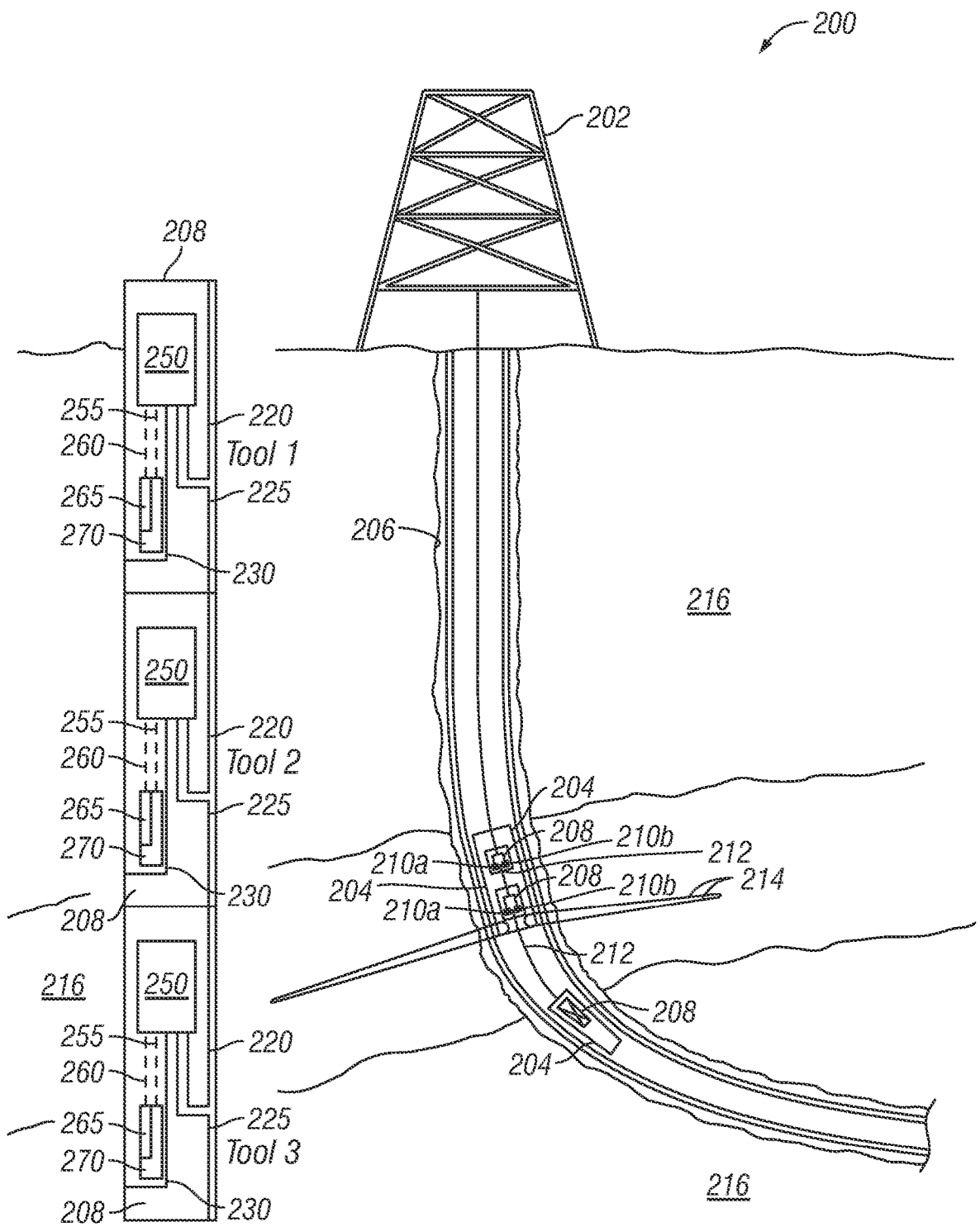
FIG. 2A illustrates a representative multitool utilization of the present invention sequentially.
FIG. 2B depicts a schematic view of a down hole tool located in a wellbore, the downhole tool having a Selective Firing Unit and DETO with ignition stage.

FIG. 2A depicts a representational, sequential configuration whereby each detonator/ignitor housing unit 208 is aligned in series. As shown, this series is comprised of legacy firing units (as illustrated in FIG. 5B infra) wherein the present invention is arranged in the following format: WHT (white) IN 220, BLU (blue) OUT 225, BLK (black) GRD (ground) 230 for Selective Firing Unit (SFU) 250 and BLK/WHT (black/white) GND (ground) 255, RED/WHT (red/white) HOT connecting separate Ignition Stage 265/DETO (detonator) 270 combination to said SFU 250. Yet it is in the contemplation of inventor to integrate said Ignition Stage 265/DETO (detonator) 270 combination into said SFU (as shown in FIG. 5C). It should further be noted that color designations are subject to modification as each particular embodiment dictates.

FIG. 2B evidences a schematic view of a well site 200 having an oil rig 202 and one or more down hole tools 204 located in a wellbore 206. The downhole tool 204, as shown, is a perforating gun having a detonator/ignitor housing unit 208 with two or more voltage standoff devices 210a and 210b. The standoff devices 210a and 210b are configured to not allow current to flow until a standoff voltage is exceeded. The detonator/ignitor housing unit 208 has an ignition element 212 that is configured to fire with the current that follows the voltage breakdown or short circuiting of the standoff devices 210a and 210b as will be described in more detail below. The ignition element 212 will detonate an ignition source, or secondary explosive, configured to launch one or more projectiles 214 into a formation 216 surrounding the perforating gun. This procedure may be repeated in numerous locations in the wellbore 206 by multiple downhole tools initiator/detonator/ignitor housing unit 208 in order to maximize hydrocarbon production in the surrounding formation 216.

Figure 3:
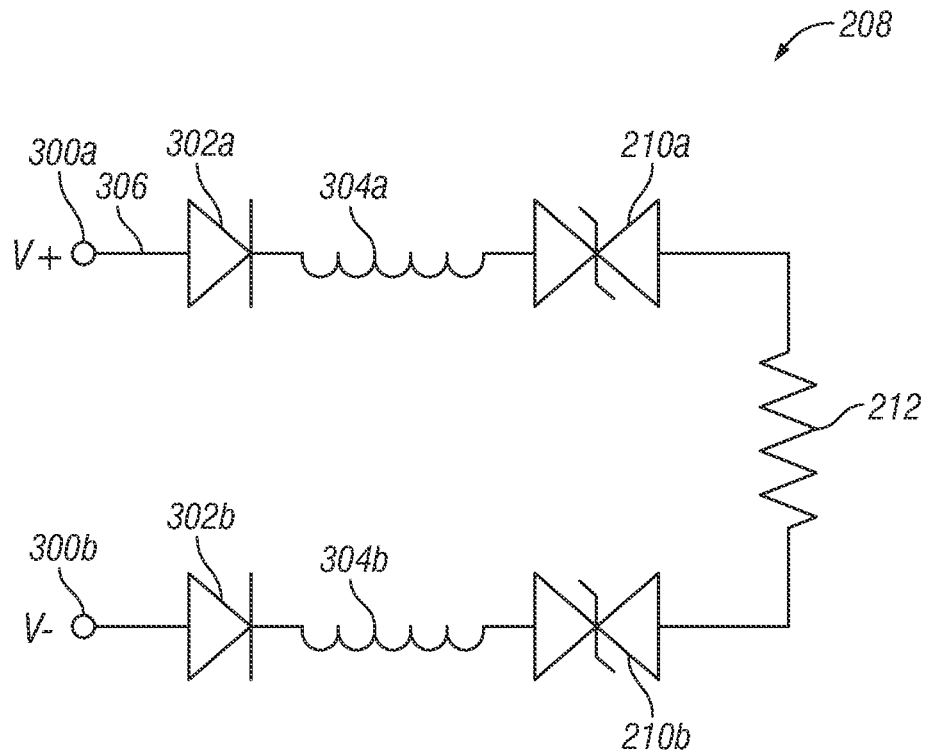
FIG. 3 depicts a schematic of detonator initiator in one exemplary embodiment.

FIG. 3 depicts a schematic view of detonator/ignitor 208 according to one embodiment. The detonator/ignitor housing unit 208 as shown is configured to include (1) terminals 300a and 300b, (2) one or more rectifier diodes 302a and 302b, (3) one or more radio frequency (RF) beads 304a and 304b, (4) a conductor 306, (5) the voltage standoff devices 210a and 210b and (6) the ignition element 212. Voltage may be applied to the terminals 300a and 300b. The rectifier diodes 302a and 302b will direct the activating polarity of the voltage through the circuit. The standoff devices 210a and 210b each have a predetermined standoff voltage, threshold voltage, or trigger current. When the current across the terminals 300a and 300b exceeds the set standoff current, the standoff devices 210a and 210b will break down or short circuit and allow current to flow to the ignition element 212. The ignition element 212 fires when it experiences the current step from the voltage breakdown of the standoff devices 210a and 210b.

The standoff device or devices 210a and 210b may be one or more thyristor devices in one preferred embodiment. The thyristor itself is a solid-state semiconductor that acts as a bistable switch. The switch conducts current when the gate receives the trigger current and continues to conduct until the voltage across the device is removed or reversed. The thyristor acts like a short circuit (for example a gating circuit) when the threshold voltage is exceeded. At the threshold voltage, the thyristor short circuits thereby allowing the current to pass through the standoff devices 210a and 210b and to the ignition element 212. The standoff devices 210a and 210b allows a large current flow without high power dissipation. Although the standoff devices 210a and 210b are thyristors in this embodiment, it should be appreciated that any suitable standoff device may be used including, but not limited to a silicon-controlled rectifier, Zener diode (allowing for retrograde current flow), and the like wherein, at a minimum, each is capable of receiving a trigger current.

In one embodiment the standoff voltage is at least 25V AC/DC in accordance with RP (Recommended Practices) for Oilfield Explosives Safety 67 Section 7.3.6.3 (b). In this embodiment each of the two standoff devices 210a and 210b will give at least a 25V AC/DC standoff voltage. The standoff devices 210a and 210b will not allow current to flow through unless the at least 25V AC/DC standoff voltage is met, thereby short-circuiting the standoff devices 210a and 210b. Although the standoff devices 210a and 210b are described as having at least a 25V AC/DC standoff voltage, it should be appreciated that any suitable standoff voltage may be used including, but not limited to, 30V, 30V-100V, and the like whereby a baseline or minimum voltage may be set. Upon the standoff devices 210a and 210b short-circuiting at the standoff voltage, the current is then sent to the ignition element 212. With redundant standoff devices 210a and 210b, the current will not flow until the sum of the standoff is exceeded. For example, if the standoff voltage is 25V in each standoff device 210a and 210b, a total of 50V in the circuit would be needed to overcome the standoff voltage. Although described as having two standoff devices 210a and 210b, it should be appreciated that any suitable number of standoff devices 210a-(n) where 'n' is any number larger than 1 (n>1) may be used including, but not limited to two, three, four or more. Theoretically speaking, the standoff element(s) may be any active element that measures voltage and enables current flow when a voltage threshold is exceeded.

The ignition element 212 fires with the current step that follows the voltage breakdown of the standoff devices 210a and 210b. In one embodiment, the ignition element 212 is a high-power resistor that is exhibits 50Ω of nichrome resistive material. The nichrome resistive material allows for operation at higher temperatures (i.e., up to 250° C.) for pyrotechnic initiation. In one embodiment, the resistor substrate may be a reducing agent such as aluminum. The reducing agent may be used to initiate higher energy redox reactions with an oxide (for example iron oxide). Although described as a high-power resistor, it should be appreciated that the ignition element 212 may be any suitable ignition element including, but not limited to, any element that translates electrical energy to a form that enables ignition.

The standoff devices 210a and 210b prevent the ignition element 212 from low order ignitions. A low order ignition occurs when a slow voltage ramp gradually heats up an ignition element 212. The standoff devices 210a and 210b prevent slow voltage ramps and supply the ignition element 212 with a voltage suitable for ignition upon reaching the standoff voltage.

The rectifier diodes 302a and 302b allow current to pass through the circuit in one direction. When voltage is applied to the terminals 300a and 300b, the activating polarity of the current will be defined by the rectifier diodes 302a and 302b in one embodiment.

The radio frequency (RF) beads 304a and 304b are, for example, ferrite beads for a higher series resistance in the presence of radio frequency (RF) in one proffered embodiment. The radio frequency (RF) beads 304a and 304b may restrict the flow of high frequency current due to radio transmitters near the detonator/ignitor housing unit 208. This will prevent the inadvertent detonation of the ignition element 212 due to transient radio signals in the wellbore. The RF beads 304a and 304b, while not an absolute requirement, may be optional components on the detonator/ignitor housing unit 208 where RF waves are a known causative agent in triggering detonation in and around a detonator.

The conductor 306 may be any suitable conductor allowing current to flow in the circuit including, but not limited to, wires, conductive tracks or pads in a circuit board and the like.

Figure 4A:
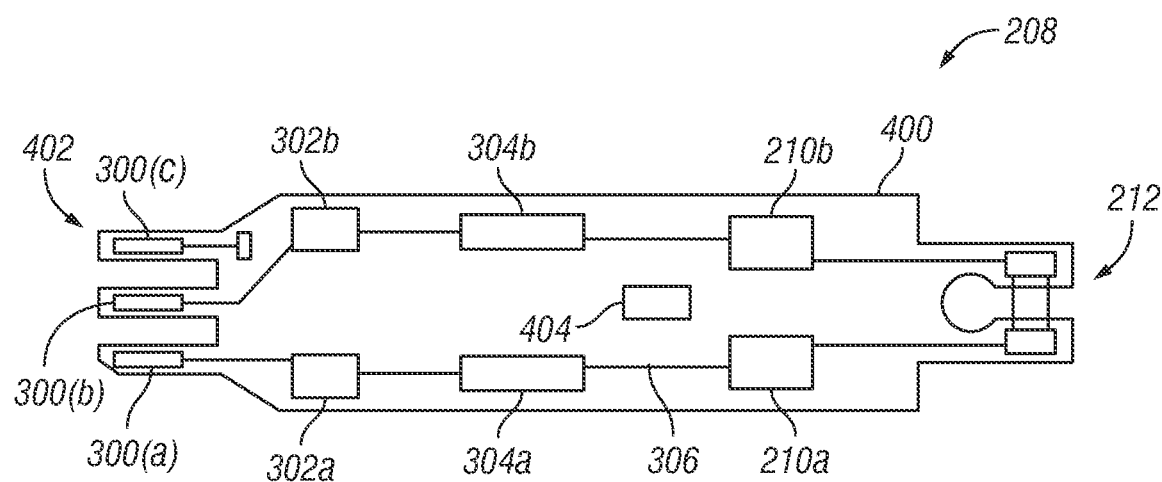
FIG. 4A depicts the detonator initiator housed on a circuit board according to another exemplary embodiment.

FIG. 4A depicts the initiator, which may be a detonator or ignitor housing unit 208, housed on a circuit board 400 according to one embodiment. The circuit board 400, as shown, has an edge connector 402. The edge connector 402 houses terminals 300a-300c. As shown, the edge connector 402 has a positive terminal 300a, a negative terminal 300b and a ground terminal 300c. The terminals 300a-300c are shown as arranged with the positive terminal 300a on the "bottom", the negative terminal 300b in the "middle" and the ground terminal 300c on "top"; however, it should be appreciated that any suitable arrangement is possible without departing from the intended design of the present invention. The edge connector 402 may allow the detonator/ignitor housing unit 208 to easily plug into an existing downhole tool 204, or harness (not shown), as will be discussed in more detail below. The "card edge", or connector edge 402, allows for a more efficient volume production of the present invention and functional testing of the detonator/ignitor housing unit 208. Moreover, for testing, the edge connector 402 may be plugged into a testing device. In embodiment, the detonator/ignitor housing unit 208 components are mounted on a standard FR4 circuit board. Although described as being on a standard FR4 circuit board, it should be appreciated that any suitable circuit board may be used. In one embodiment the circuit board 400 is made of polyamide although it should be understood that the circuit board may be made of any suitable material.

The circuit board 400 as shown includes the terminals 300a-c, the rectifier diodes 302a and 302b, the RF beads 304a and 304b, the stand-off devices 210a and 210b and the ignition element 212. It should be further appreciated that other suitable components may be included on the circuit board 400 for any number of suitable uses. These additional devices may include but are not limited to an RFID tag 404, active components that enable communication and control, active elements that emulate the stated passive elements, sensor components and the like. An RFID tag 404, which may be "passive", "active", low energy "active (BLE low technology) or a combination thereof, may be used for tracking the location of the detonator/ignitor housing unit 208. Tracking the location of the detonator/ignitor housing unit 208 allows a user to verify or authenticate a specific detonator/ignitor's housing unit 208 location in the wellbore 206. In addition to location tracking, the RFID tag 404 may be used for device identification, inventory, tracking, location, timing, monitoring, determination of physical state, traceability and the like.

The circuit board 400 may be one sided, two sided or multi-sided (e.g., consisting of a plurality of connected sides). Expressly, in the two-sided configuration, the same or similar hardware may be located on both sides of the circuit board 400. This configuration may add to the robustness of the design by allowing one side to continue to fire in the event that the second side is damaged or malfunctions. This configuration may also enable more complex initiation scenarios with the control of initiator timing. The two-sided circuit board 400 may harbor a single edge connector 402 having the terminals 300a-c on both sides of the circuit board 400. The circuit board 400 may be designed with three terminals 300(a-c) on each side and/or on opposite ends. The opposing terminals 300 may be designed to enable the shorting of opposing mating connectors in the harness assembly. With this, devices connected to a harness may be put into a specific electrical state. For example, an additional detonator/ignitor housing unit 208 connected to a harness may be put in a safer, shunted state or conformation.

The circuit board 400 may be a printed circuit board (PCB) according to one embodiment. The PCB allows for the detonator/ignitor housing unit 208 to be mechanically assembled autonomously and thereby mass produced. Although the circuit board 400 is described as being a PCB it should be appreciated that any suitable method for manufacturing the circuit board 400 may be used including, but not limited to, wire wrap, multichip module(s), flex circuit(s), point-to-point construction, and the like.

Figure 4B:
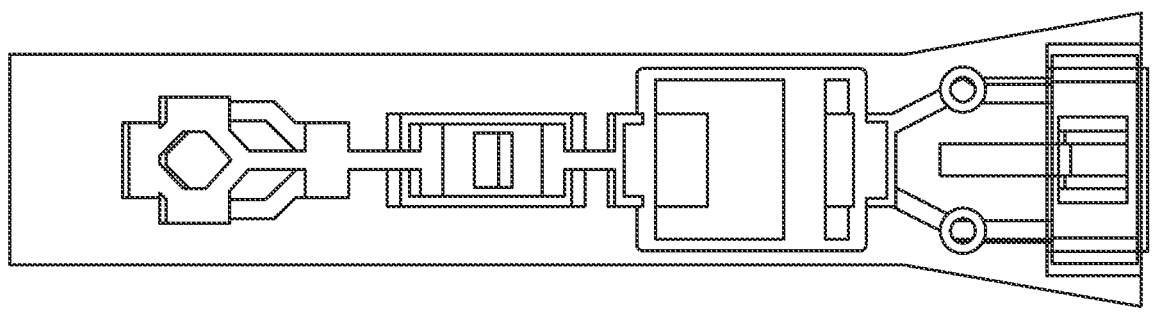
FIG. 4B and FIG. 4C are a top view and side perspective view of the present invention, respectively.
Figure 4C:
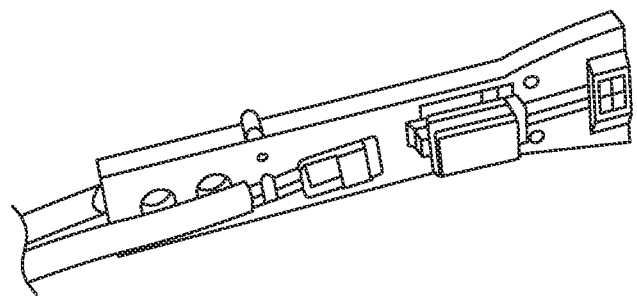

In another embodiment, the two-sided circuit board 400 configuration may assist with selective firing of the detonator/ignitor housing unit 208. The additional surface area may allow addition of components that enable selective firing (as detailed above) and may be observed representationally additionally in FIGS. 4B and 4C.

Figure 5A:
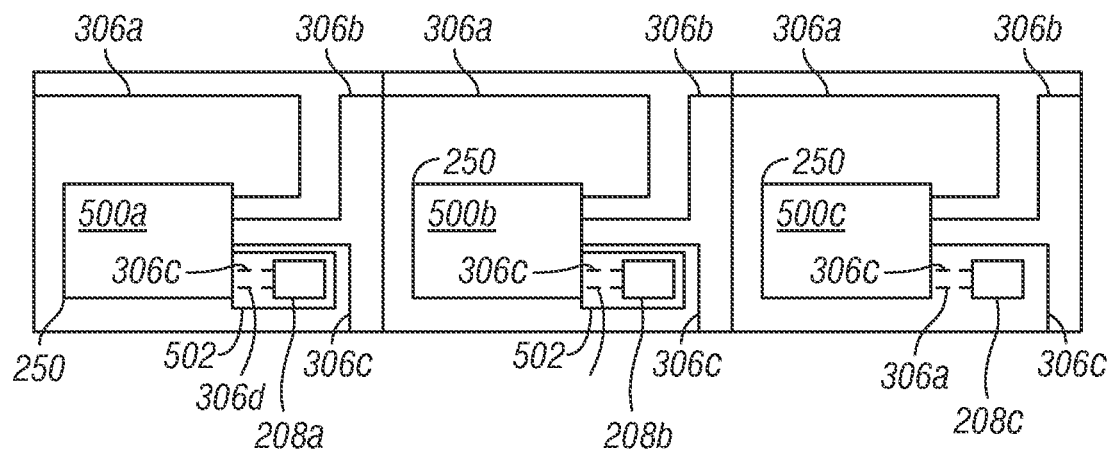
FIG. 5A depicts a schematic view of several selective firing devices in series with detonators with the proposed internal detonator initiators.
Figure 5B:
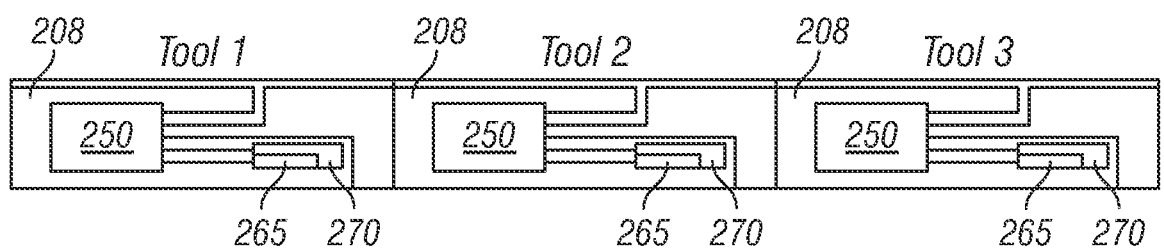
FIG. 5B shows the detonators with legacy selective firing units.
Figure 5C:
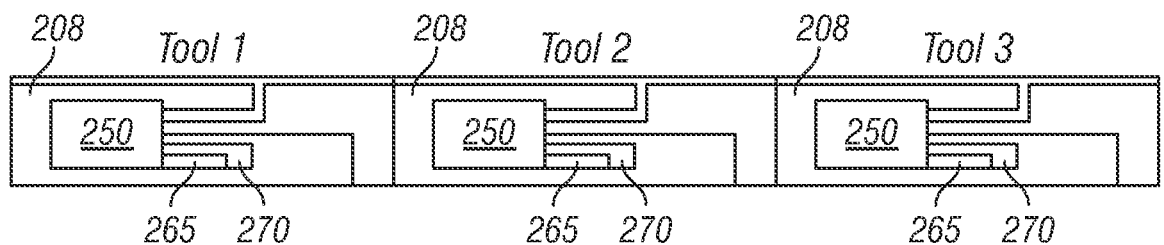
FIG. 5C shows an alternative configuration of the detonator initiators integrated into the Selective Firing Unit (SFU).

FIG. 5A depicts a schematic view of several selective firing units 500a-c, or devices, in series (as provided in FIG. 2A). As shown, there are three 3 detonators/ignitor housing units 208 in series. The detonators/ignitors 208a-n may be located in close proximity to one another in the down hole tool 204, spaced out in a downhole tool 204, and/or in separate downhole tools 204 in the wellbore. Although there are three selective firing units (SFUs) 500a-500c shown in series, it should be appreciated that any number of selective firing units 500n and detonators/ignitors 208n may be connected. As shown, the detonator/ignitor 208a is the first stage of the series of detonators/ignitors, 208a-c, which may include any number 208n. As shown each detonator/ignitor 208a-n includes generally a selective firing unit 500a-n, an IN voltage conductor 306a (equivalent to 220 of FIG. 2A), an Out voltage conductor 306b (equivalent to 225 of FIG. 2A), one or more ground conductors 306c (equivalent to 230 and 255 of FIG. 2A), and a hot or positive conductor to the detonator/ignitor 306d (equivalent to 260 of FIG. 2A). The ground connection may be integrated within a conductive enclosure such that there are only two wires (power IN and Power OUT), in addition to ground, as in 500a and 500b, or separate, additionally including an additional ground and 'Hot' wire from detonator/ignitor 208 to SFU 250, as in 500c. And while FIG. 5B depicts an externally residing detonator/ignitor 208 from SFU 250, and FIG. 5C shows an integrated detonator/ignitor 265/270 with SFU 250, it is equally so that integrated and nonintegrated detonator/ignitor units 208n may be used interchangeably, as requirements dictate, in series or parallel (not shown) wherein 208a and 208b are integrated and 208c is not.

The selective firing unit 500a-n is configured to couple to the detonator/ignitor 208a-n and selectively supply the detonator with electrical power. A command to the selective firing unit may be used to selectively supply power to the detonators/ignitors 208a-n. With the command to supply power to the detonator/ignitor 208a-n by the selective firing unit 500a-n an operator may select any of the detonators/ignitors 208a-n in the downhole tool 204, or tools 204a-n, to "fire" (i.e., ignite") based on their location. For example, the operator may command a stage three detonator/ignitor 208c to be supplied power and fire and then later command the stage one detonator/ignitor 208a to be supplied power and fire. Each of the detonators/ignitors 208a-n shown include the standoff devices 210a and 210b and the ignition element 212. The detonator/ignitors 208a-n may be in close proximity or coupled to a secondary explosive 502a-n or detonator for a ballistic chain. Upon commanding the detonator/ignitor 208 to fire and reaching the standoff voltage, the standoff devices 201a and 210b will short and send power to the ignition element 212. The ignition element 212 may then ignite or detonate a secondary explosive 502 for the application. The detonator/ignitor 208c is shown as uncoupled from the selective firing unit 500c. The detonators/ignitors 208 may be plugged into the selective firing units 500. The detonators may also integrate the selective firing function, FIG. 6a. The integrated circuitry may be utilized to coordinate detonation(s) in time (e.g., in succession or simultaneously) through directed commands.

Figure 6A:
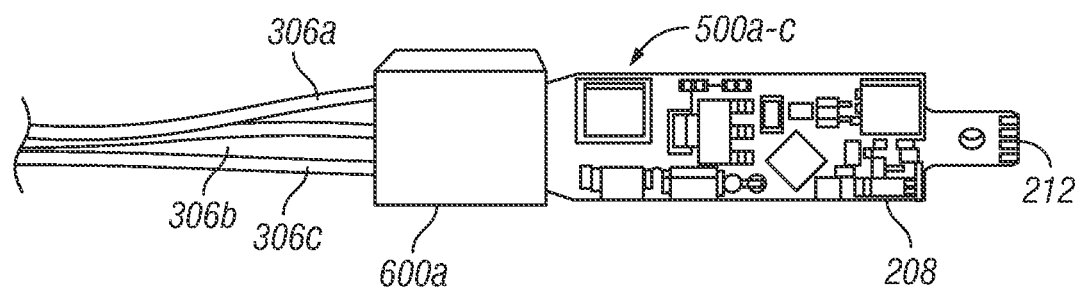
FIG. 6A shows an embodiment of the addressable ignition stage plugged into a harness with 2 to 3 wires wherein the addressable and ignition functions are combined.

FIG. 6A shows an embodiment of the detonator/ignitor 208, with selective firing circuitry, plugged into a harness 600a. The detonator/ignitor housing unit 208 may include any of the components described herein, including, but not limited to an ignition element 212, a selective firing unit 250, one or more standoff devices 210a and 210b, telemetry circuitry, and the like. Harness 600a is configured to couple to three wires or conductors 306a, 306b, and 306c. As shown, the harness 600a has an IN power conductor 306a, an OUT power conductor 306b and a ground conductor 306c. The detonator/ignitor 208 may have its connector edge 402 (FIG. 4A) configured to couple and connect in the harness 600a. In this embodiment, only half of the harness 600a, or connector, is used. For example, the harness 600a may be used with a one-sided circuit board 400 (FIG. 4A) having a connector edge 402 with three terminals 300a-c configured to couple to the conductors 600a-c when connected to the harness 600a.

Figure 6B:
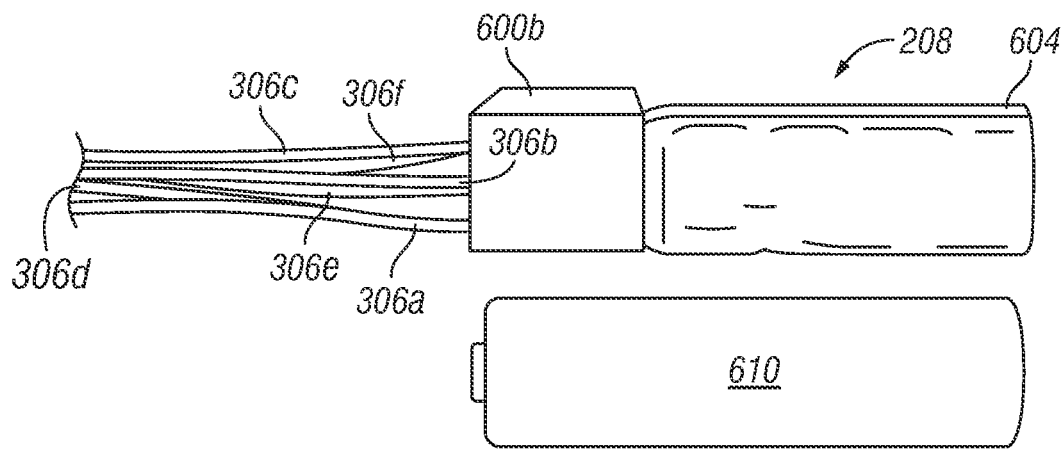
FIG. 6B shows an embodiment of the addressable stage plugged into a harness with 5 to 6 wires wherein 2 of these wires may connect to a legacy detonator or an external ignition stage as in ignition element shown in FIG. 6A being removed and a AA battery inserted for size reference.

FIG. 6B shows a legacy selective firing switch in a harness 600b, which may be coupled to a legacy detonator or proposed initiator/detonator/ignitor housing unit 208 wrapped in an insulator 604. The detonator/ignitor 208 may include any of the components described herein, including, but not limited to an ignition element 212, a selective firing unit 250, one or more standoff devices 210a and 210b, and the like, or a combination thereof. Harness 600b is configured to couple to six wires or conductors 306a, 306b, 306c, 306d, 306e, and 306f. As shown, the harness 600b has an IN power conductor 306a, an OUT power conductor 306b, a ground conductor 306c, a second ground conductor 306d, a third ground conductor 306e, and a red conductor 306f. When harness 600b is uncoupled from detonator/ignitor 208 the following wire pairs are shorted: the IN power conductor 306a is shorted to the ground conductor 306d, the OUT power conductor 306b is shorted to the third ground conductor 306e, and the external initiator or red conductor 306f is shorted to the ground 306c thereby leaving the harness 600b, which is connected to a legacy detonator or proposed initiator/detonator/ignitor 208, in a safe mode. When the edge connector 402 of the legacy selective firing switch is inserted in a harness 600b, as shown, the shorted pairs described above, unshunt and mate with the respective terminals 300a-f on the edge connector 402. AA battery 610 is provided for approximate size comparison.

An initiator may be made optional such that the integrated initiator or an external (legacy) initiator may be used. The configuration choice may be done in manufacturing by routing the initiator off and having additional card edge connections on the other side of the circuit board 400 created.

Figure 7:
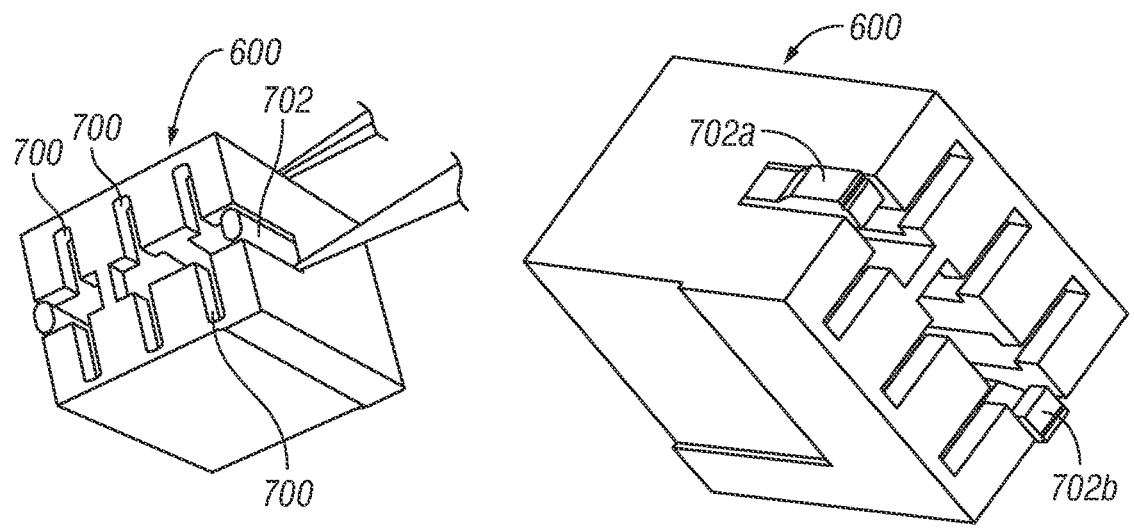
FIG. 7 depicts an isometric view of a harness in one preferred embodiment.

FIG. 7A depicts an isometric view of a harness connector 600 in an embodiment which may be populated with 3, 5 or 6 crimped wires 306a-c of FIG. 6A and 306 a-f of FIG. 6B. Harness connector 600 with wires 306 as shown in FIGS. 6A and 6B are configured to receive a detonator/ignitor 208 using 2 wires of the connector. The edge connector 402 of the detonator/ignitor 208a-c may be inserted into any one of the slots 700 and thereby coupled to the conductors 306. The harness of FIG. 7 may have a retention device 702 configured to hold the detonator/ignitor 208 in place once each is inserted. As shown, the retention device 702 is a type of leaf spring with a latch configured to 'lock in' the circuit board 400 of the detonator/ignitor 208. Although shown as a latch, it should be appreciated that the retention device 702 may be any suitable retention device including, but not limited to, a pin, a lock, a clip, a clasp or similar device made to reversibly adhere circuit board 400 on to and into harness connector 600. When connected the harness 600 said harness 600 may retain the detonator/ignitor 208 in order to resist tensile force between the harness 600 and the connector edge 402 and risk coming dislodged. FIG. 7B illustrates a harness 600 whereby retention device 702 consists of a 'clip' or 'clasping' structure 702a and 702b residing superiorly and inferiorly, or, alternatively viewed, on each of the left and right sides.

Figure 8:
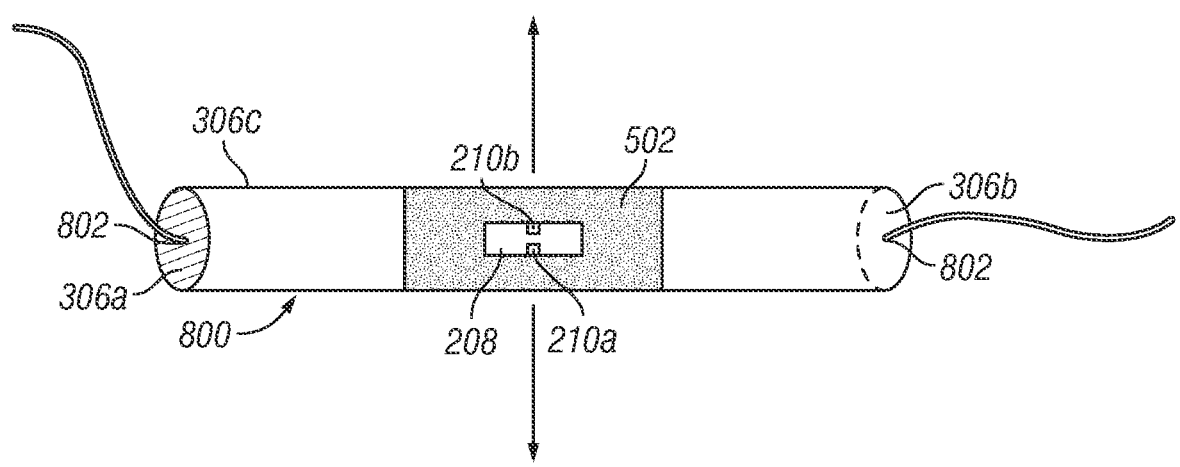
FIG. 8 depicts the detonator initiator, or detonator initiator with integrated SFU, housed in a conductive cylinder with 1 or 2 wires from one or both sides.

FIG. 8 depicts the detonator/ignitor 208 configured to be housed in a conductive cylinder 800. The shell of the conductive cylinder 800 may be used as the ground conductor 306c, which will be insulated from a conductive center contact 802. One side of the conductive center contact 802 serves as the positive conductor 306a, or IN, while the other side of the conductive center 802 serves as the negative conductor 306*b*, or OUT. This detonator/ignitor housing unit 208 of FIG. 8 may be centered in a secondary explosives 502 to allow for radial energy dispersion into a ring of ballistic, shape charges or ballistic primer cord 214 (as shown in FIG. 2B). In this embodiment, the conductive center 802 may be any suitable conductor including, but not limited to, wires, cables, and the like. In one embodiment, ends of the conductive center 802 may be shaped like the ends of an AA battery to imply positive and negative connection polarity.

This detailed description refers to specific examples in the drawings and illustrations. These examples are described in sufficient detail to enable those skilled in the art to practice the inventive subject matter. These examples also serve to illustrate how the inventive subject matter can be applied to various purposes or embodiments. Other embodiments are included within the inventive subject matter, as logical, mechanical, electrical, and other changes can be made to the example embodiments described herein. Features of various embodiments described herein, however essential to the example embodiments in which they are incorporated, do not limit the inventive subject matter as a whole, and any reference to the invention, its elements, operation, and application are not limiting as a whole, but serve only to define these example embodiments. This detailed description does not, therefore, limit embodiments of the invention, which are defined only by the appended claims. Each of the embodiments described herein are contemplated as falling within the inventive subject matter, which is set forth in the following claims.

Plural instances may be provided for components, operations or structures described herein as a single instance. In general, structures and functionality presented as separate components in the exemplary configurations may be implemented as a combined structure, component or series of components. Similarly, structures and functionality presented as a single component may be implemented as separate components. These and other variations, modifications, additions, and improvements fall within the scope of the inventive subject matter.

What is claimed is:

1. An addressable ignition stage device configured to actuate a primary or secondary explosive following voltage breakdown in a detonator/ignitor comprising:
    voltage accepting terminals;
    one or more conductors;
    one or more rectifier diodes;
        said one or more rectifier diodes directing activating polarity of applied voltage;
    one to a plurality of voltage standoff devices;
        said voltage standoff device or devices having a standoff voltage, threshold voltage, or trigger current;
        said voltage standoff device or devices comprising a thyristor voltage standoff device or devices configured to allow current flow to an ignition element only upon reaching voltage breakdown by exceeding said standoff voltage, threshold voltage, or trigger current; and
        said ignition element firing upon receiving current step from voltage breakdown.

2. The addressable ignition stage device of claim 1 wherein said addressable ignition stage device further comprises one or more radio frequency beads;
    said radio frequency bead or beads restricting flow of high frequency current due to radio transmitters near the detonator/ignitor to prevent inadvertent detonation.

3. The addressable ignition stage device of claim 2 wherein said thyristor comprises one thyristor standoff device to a plurality of thyristor voltage standoff devices each having a standoff voltage, threshold voltage, or trigger current, divided proportionately between standoff devices, to protect input and output circuitry from transient voltages.

4. The addressable ignition stage device of claim 2, where said radio frequency beads are ferrite beads for a higher series resistance in the presence of radio frequency (RF).

5. The addressable ignition stage device of claim 1 wherein said ignition element is a high-power resistor with a nichrome resistive of 50Ω.

6. The addressable ignition stage device of claim 1 wherein said thyristor voltage standoff devices are in series or parallel wherein each may have the same or different threshold standoff voltages.

7. The addressable ignition stage device of claim 1 wherein said addressable ignition stage device is coupled with and adhered to a thermally conductive substrate allowing for operation at high temperatures.

8. The addressable ignition stage device of claim 1, wherein said addressable ignition stage device is configured on a circuit board which is a single sided, dual sided, or multi-sided edge connector with terminals configured to couple to a separate connector harness.

9. The addressable ignition stage device of claim 8 whereby said connector harness is configured with opposing contacts that short when the circuit board is not inserted whereby shorting connectors keep the addressable ignition stage device in a known safe state.

10. The addressable ignition stage device of claim 8 whereby said connector harness is designed with built-in mechanical retention and/or keying for insertion of a circuit board.

11. The addressable ignition stage device of claim 8 whereby said connector harness is designed such that only one side, both sides or multiple sides are used for selective firing, redundancy, robustness, or a combination thereof.

12. The addressable ignition stage device of claim 1, whereby said addressable ignition stage device may be RFID tagged for location tracking, identification, authentication, spatial locating, timing, monitoring, determination of physical state, trackability or a combination thereof.

13. The addressable ignition stage device of claim 1, whereby said addressable ignition stage devices may be configured in series, in close proximity or coupled to a secondary explosive for simultaneous firing or detonations in succession.

* * * * *